United States Patent [19]

Stowers

[11] 4,417,206

[45] Nov. 22, 1983

[54] ELECTRICAL CONTACT PROBE AND METHOD OF MANUFACTURING

[75] Inventor: Jeffrey P. Stowers, Mt. Sidney, Va.

[73] Assignee: Virginia Panel Corporation, Waynesboro, Va.

[21] Appl. No.: 241,681

[22] Filed: Mar. 9, 1981

[51] Int. Cl.³ ............................................. G01R 1/06
[52] U.S. Cl. ................................ 324/158 P; 324/72.5
[58] Field of Search ............... 324/158 P, 158 F, 72.5, 324/149; 339/108 TP

[56] References Cited

U.S. PATENT DOCUMENTS 3,996,516 12/1976 Luther ............................. 324/158 F
4,105,970 8/1978 Katz ................................ 324/158 P

OTHER PUBLICATIONS

Cat. No. 104, Virginia Panel Corporation, Waynesboro, Va. 22980.

*Primary Examiner*—Ernest F. Karlsen
*Attorney, Agent, or Firm*—B. P. Fishburne, Jr.

[57] ABSTRACT

A simplified and more economical manufacturing method for the contact head of a spring contact probe is disclosed. Only two passes of a machining tool across the axis of the contact head on orthogonal axes produces a center pyramid contact point, two pairs of surrounding chisel points, and two pairs of contact points in the spaces between the chisel points formed from metal remaining after the two machining passes.

3 Claims, 5 Drawing Figures

U.S. Patent  Nov. 22, 1983  4,417,206
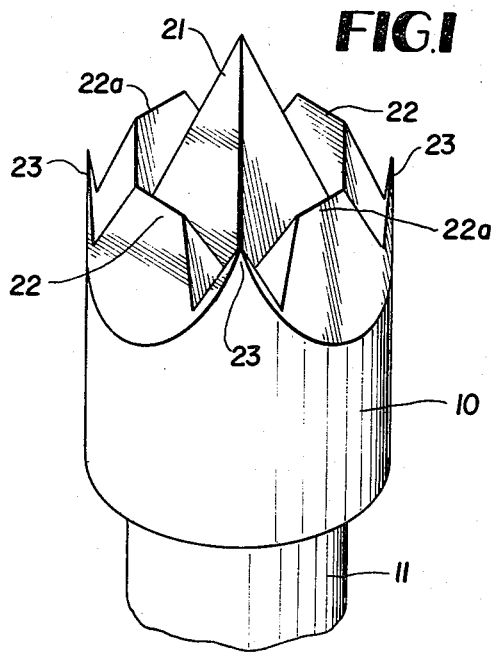
FIG.1
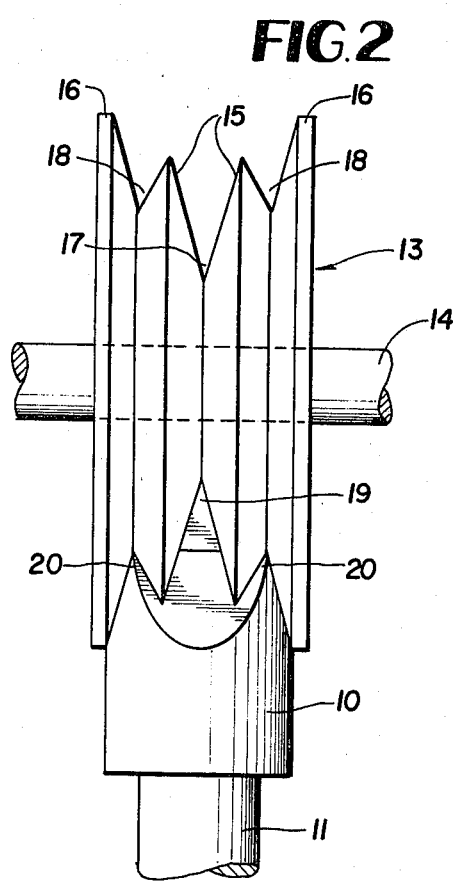
FIG.2
FIG.3
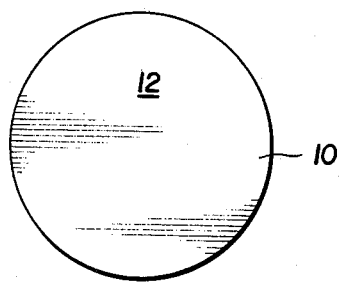
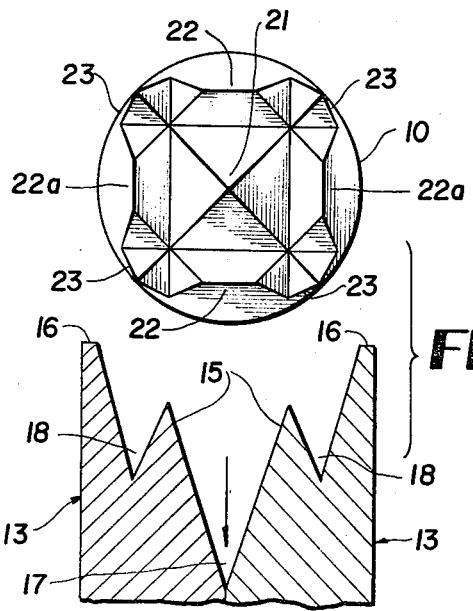
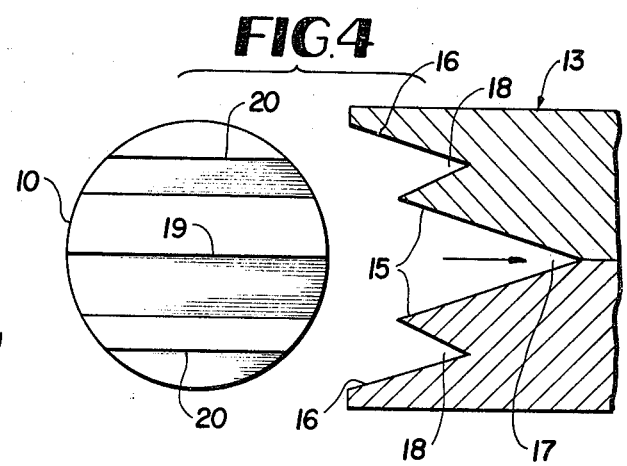
FIG.4
FIG.5

ELECTRICAL CONTACT PROBE AND METHOD OF MANUFACTURING

BACKGROUND OF THE INVENTION

Multi-pointed contact pins and test probes of minute sizes are known in the prior art evidenced by U.S. Pat. No. 4,105,970 and Catalog No. 104 of Virginia Panel Corporation, Waynesboro, Va. The electrical contact heads of such probes require expensive machining operations to complete. In some cases, six to eight machine steps are necessary.

The present invention comprises a drastic improvement and simplification of the method of manufacturing the heads of contact probes in which machining is reduced to two simple passes of a machining cutter across the axis of the contact head on orthogonal machining paths or axes. The resulting contact head is novel and includes a center pyramid point surrounded by four chisel points arranged in two pairs orthogonally. Left over metal between the chisel points forms four more circumferentially equidistantly spaced very sharp contact points surrounding the center pyramid point across the corners of the latter.

BRIEF DESCRIPTION OF THE DRAWINGS

FIG. 1 is a perspective view showing the contact head of a probe produced by the simplified machining process of the present invention.

FIG. 2 is a side elevation of the contact head in relation to a machine cutter.

FIG. 3 is a end elevation of the contact head prior to machining.

FIG. 4 is a similar view of the contact head after the first machining pass by a profiled cutter shown schematically in cross section.

FIG. 5 is a similar view of the contact head after the second and final machining pass by the cutter shown schematically in cross section on a second orthogonal axis.

DETAILED DESCRIPTION

Referring to the drawings in detail, the numeral 10 denotes the cylindrical body or head of a contact probe, such as a spring probe, having a shank 11 of lesser diameter than the head 10. Prior to machining, FIG. 3, the end face 12 of the contact head 10 is flat and perpendicular to the axis of the probe.

A simplified machining method employs a single profiled milling-type cutter 13 shown schematically in the drawings and having a rotatable shaft 14 driven in a conventional manner. The machining process involves only two linear passes of the cutter 13 on orthogonal axes across the axis of the contact head, such two passes of the cutter 13 at right angles being depicted in FIGS. 4 and 5 to complete the contact head shown in FIGS. 1 and 5.

The cutter 13 comprises a pair of laterally spaced peripherally tapered cutter elements 15 having opposite side converging cutting faces which are appropriately toothed in accordance with conventional practice. Two outside cutting components 16 are included having interior divergent cutting faces which extend radially beyond the peripheries of the interior components 15. The interior cutting faces of components 15 define a center deep V-cross section cavity 17 in the cutter 13 and two similar cavities 18 of lesser radial depth are formed on the profiled cutter between the inner and outer components 15 and 16.

In the machining process, FIGS. 4 and 5, a first pass of the cutter 13 across the longitudinal axis of the cylindrical head 10 is depicted in FIGS. 2 and 4, on a first orthogonal axis. The depth of the cut is shown in FIG. 2, whereby the full radial distance from the bottom of the groove or recess 17 to the periphery of the cutter is utilized.

This first machining pass forms on the contact head 10 a center diametrical ridge 19 and two parallel outer ridges 20, as shown in FIG. 4.

Following this, a second pass of the cutter 13 on a second orthogonal axis, FIG. 5, takes place to complete the machining of the contact head, as illustrated in FIG. 5 and also in FIG. 1. This second machining pass is across the previously-formed ridges 19 and 20 at right angles thereto with the depth of cut the same as illustrated in FIG. 2 for the first pass. During each orthogonal pass of the cutter, the center cutter recess 17 is accurately positioned laterally to lie on the longitudinal axis of the head 10.

Following the second and final machining pass, as described, the finished contact head has a center precision formed pyramid point 21 and two pairs of precision chisel points 22 and 22a surrounding the pyramid point 21 and disposed on two orthogonal axes and being circumferentially equidistantly spaced and symmetrically arranged relative to the pyramid point and also being equally sized and identically contoured. The tips of chisel points 22 and 22a lie in a common plane across the axis of the head 10 and are spaced axially inwardly from the point or tip of pyramid 21 by a distance equal to the difference in radial depths of cutter recesses 17 and 18.

Metal left over after the two machine passes forms between the spaced chisel points 22 and 22a or circumferentially equidistantly spaced contact points 23, as illustrated. The tips of these additional contact points are in a common plane with the tips of the four chisel points, and the eight elements 22, 22a and 23 symmetrically surround the center pyramid point 21. The chisel points 22 and 22a lie opposite the convergent side faces of the pyramid point 21, and the points 23 are aligned radially with the four corners of the pyramid point 21. Perfect symmetry for the contact head 10 is achieved consistently with the simple two step machining process, the advantages of which should be readily apparent to those skilled in the art.

It is to be understood that the form of the invention herewith shown and described is to be taken as a preferred example of the same, and that various changes in the shape, size and arrangement of parts may be resorted to, without departing from the spirit of the invention or scope of the subjoined claims.

I claim:

1. In an electrical contact probe, a cylindrical contact head, a center leading pyramid contact point on the head, two pairs of identical chisel contact points on the head in concentric surrounding relationship to the pyramid point and having their tips disposed in a common plane perpendicular to the longitudinal axis of the head and axially rearwardly of the tip of the center pyramid point, the chisel points lying in radial alignment with the four side faces of the pyramid point, and four additional contact points on the head disposed between the chisel points and being in radial alignment with the corners of the central pyramid point and surrounding the latter concentrically.

2. In an electrical contact probe as defined in claim 1, and the tips of the last-named points lying in a common plane with the tips of said chisel points.

3. In an electrical contact probe as defined in claim 1, and the tips of the chisel points being disposed on lines which are parallel to planes occupied by the four side faces of the pyramid point.

* * * * *